(12) United States Patent  (10) Patent No.: US 8,125,075 B2
Maveety et al.  (45) Date of Patent: Feb. 28, 2012

(54) CARBON NANOTUBE MICRO-CHIMNEY AND THERMO SIPHON DIE-LEVEL COOLING

(75) Inventors: James G. Maveety, San Jose, CA (US); Gregory M. Chrysler, Chandler, AZ (US); Unnikrishnan Vadakkanmaruveedu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1062 days.

(21) Appl. No.: 12/014,713

(22) Filed: Jan. 15, 2008

(65) Prior Publication Data

US 2012/0021566 A1   Jan. 26, 2012

Related U.S. Application Data

(62) Division of application No. 11/305,464, filed on Dec. 16, 2005, now Pat. No. 7,335,983.

(51) Int. Cl.
*H01L 23/473* (2006.01)
(52) U.S. Cl. . 257/706; 257/707; 257/713; 257/E23.097; 257/E23.098; 977/720; 977/742
(58) Field of Classification Search .......... 257/706, 257/707, 713, E23.097, E23.098; 977/720, 977/742
See application file for complete search history.

(56) References Cited

U.S. PATENT DOCUMENTS

| | | | |
|---|---|---|---|
| 2004/0152240 A1* | 8/2004 | Dangelo | 438/122 |
| 2006/0233694 A1* | 10/2006 | Sandhu et al. | 423/447.3 |
| 2006/0278901 A1* | 12/2006 | Dangelo et al. | 257/276 |
| 2008/0029909 A1* | 2/2008 | Hijzen et al. | 257/784 |
| 2011/0021016 A1* | 1/2011 | Awano et al. | 438/610 |

* cited by examiner

*Primary Examiner* — Victor A Mandala
(74) *Attorney, Agent, or Firm* — Kenneth A. Nelson

(57) ABSTRACT

A method, apparatus and system with a semiconductor package including a microchimney or thermosiphon using carbon nanotubes to modify the effective thermal conductivity of an integrated circuit die.

6 Claims, 7 Drawing Sheets

US 8,125,075 B2

CARBON NANOTUBE MICRO-CHIMNEY AND THERMO SIPHON DIE-LEVEL COOLING

This application is a divisional application of prior application Ser. No. 11/305,464 which was filed on Dec. 16, 2005 now U.S. Pat. No. 7,335,983 and for which a Notice of Allowance was mailed on Oct. 9, 2007.

TECHNICAL FIELD

The invention relates to the field of microelectronics and more particularly, but not exclusively, to integrated circuit thermal management using carbon nanotubes.

BACKGROUND

Under normal operation, an integrated circuit, for example a microprocessor, generates heat that must be removed to maintain the device temperature below a critical threshold and thereby maintain reliable operation. The threshold temperature derives from many short and long term reliability failure modes and may be specified by a circuit designer as part of a normal design cycle.

The evolution of integrated circuit designs has resulted in higher operating frequency, increased numbers of transistors, and physically smaller devices. This continuing trend generates ever increasing area densities of integrated circuits and electrical connections. To date, this trend has resulted in increasing power and heat flux, in addition to increasingly non-uniform heat fluxes across the die. Further, the trend to higher power and higher, non-uniform heat flux microelectronic devices may be expected to continue into the foreseeable future, demanding continual improvement in cooling technology, at each packaging level, to prevent occurrence of thermally induced failures.

The problem of maintaining device temperature below a critical threshold value may be addressed at various levels of packaging. For example, a heat sink is a common board level component, a fan a common system level component, and a thermally conductive packaging material a common device level component. A design team may thus choose various combinations of device, board, and system level components when faced with a particular thermal challenge.

DETAILED DESCRIPTION

The following detailed description makes reference to the accompanying drawings, which form a part hereof and show specific embodiments by way of illustration. Regarding the drawings and detailed description, like numerals designate like parts throughout. Embodiments other than those presently described and illustrated may be practiced, and, further, structural and/or logical changes may be made, without deviating from the intended scope of the appended claims and their equivalents. Directions and references (e.g., up, down, top, bottom, primary side, backside, etc.) may be used to facilitate discussion of the drawings and are not intended to restrict the implementation of various embodiments not presently described or illustrated. Therefore, the following detailed description is not to be taken as limiting and only the appended claims and their equivalents define the broad range of possible embodiments.

Increasing system performance may require increased package thermal performance. If power dissipation (hence rate of heat transfer from the package) and overall system performance correlate, overall system performance may suffer if a package overly constrains heat transfer from the package. Conversely, reduced package thermal resistance may improve the possibility of increased overall system performance.

In an electronic package where a major portion of the heat generated by a die may pass through a single external surface of the package, a model characterizing the rate of heat transfer, q, from the package is given by $q = \Delta T / R_{thermal}$, where $\Delta T$ represents a temperature gradient and $R_{thermal}$ represents a thermal resistance. The temperature gradient, $\Delta T$, describes the temperature difference between a temperature on the die and a temperature on the external surface through which the major portion of heat generated passes. The thermal resistance, $R_{thermal}$, describes the expected temperature gradient per unit heat transfer rate.

An allowable temperature gradient, $\Delta T_{allowable}$, may be constrained by system cooling capabilities, and by integrated circuit reliability concerns. Under a given power dissipation, a system may only be capable of cooling the external surface of the package to a given temperature. Further, integrated circuit reliability concerns may impose a limit on die temperature, beyond which reliable operation may be at risk. Thus, for a given package thermal resistance, $R_{thermal}$, the maximum allowable heat transfer rate (and hence power dissipation at the die), $q_{allowable}$, may be determined as the quotient of allowable temperature gradient and package thermal resistance, $q_{allowable} = \Delta T_{allowable} / R_{thermal}$. Therefore, where system performance correlates to power dissipation, a reduction in package thermal resistance may result in a corresponding increase in system performance.

Figure 1:
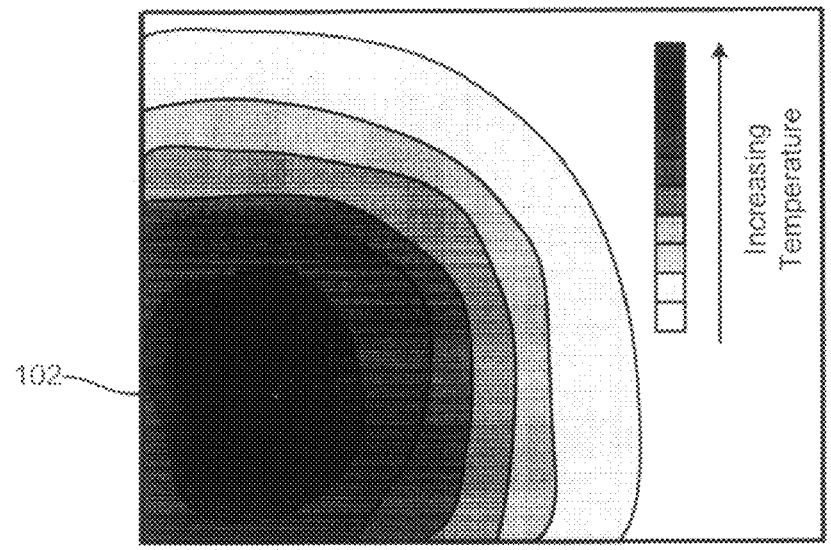
FIG. 1 illustrates an area plot of a temperature field within a prior art die with regions of increased heat flux and without benefit of carbon nanotube micro-chimneys or thermosiphons.
Figure 2:
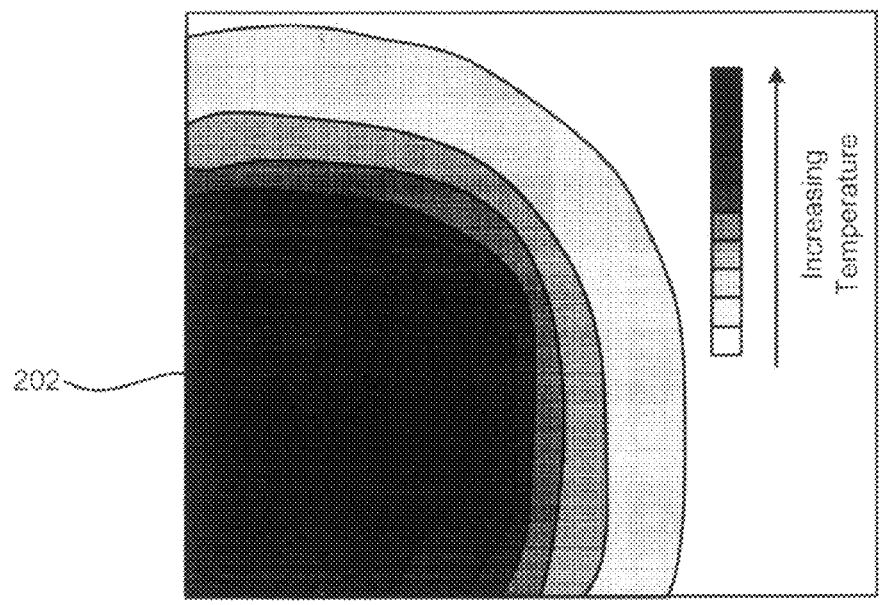
FIG. 2 illustrates an area plot of a temperature field within a die with regions of increased heat flux and the benefit of carbon nanotube micro-chimneys or thermosiphons.

Accordingly, numerical models demonstrate that an increase in thermal conductivity of an integrated circuit die results in a decrease in the die's thermal resistance, a major contribution to overall package thermal resistance. Comparison of FIG. 1 and FIG. 2 graphically demonstrates the effect of increasing thermal conductivity on die temperature. FIG. 1 illustrates the temperature field at a plane within a prior art die without benefit of carbon nanotube enhanced cooling heated by a concentrated heat source. In the region near the heat source 102, the temperature is significantly higher than near the edges of the die, as illustrated by the concentric bands, each representing small ranges of temperature. In contrast, FIG. 2 illustrates the temperature field, using the same temperature scale as FIG. 1, at a plane within a die using carbon nanotube enhanced cooling, heated by a heat source identical to that used in the model illustrated by FIG. 1. The temperature of the region near the heat source 202 is significantly lower (approximately 20% in the present example) than the region 102. Further, the temperature gradient across the die of FIG. 2 is less than that across the die of FIG. 1. Reduced die level temperature gradients incur benefits, such as reduction in thermally induced mechanical stresses, increased reliability, and increased integrated circuit performance.

Carbon nanotubes ("CNT"), small, hair like filaments containing carbon (see FIGS. 3 and 4), have high thermal conductivity. A typical axial thermal conductivity of a CNT ranges from approximately 3000 W/mK to 6000 W/mK, for multi-walled and single walled varieties, respectively. Inclusion of CNT in a die with an integrated circuit and non-uniform heat flux increases the effective thermal conductivity of the die, in turn causing the die to exhibit thermal behavior similar to that modeled by FIG. 2.

Figure 4:
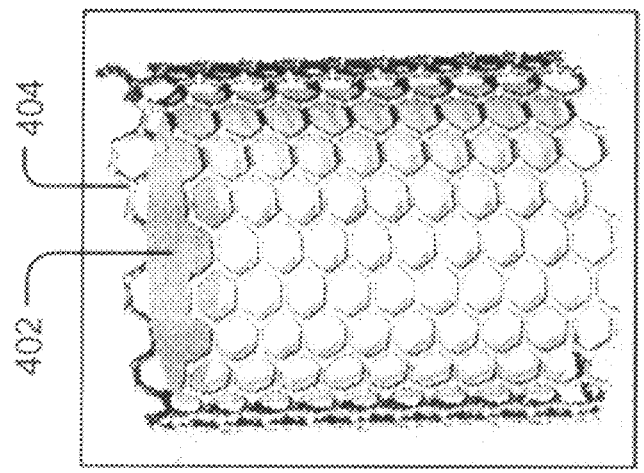
FIG. 4 illustrates a schematic representation of a single walled carbon nanotube with a metallized wall.
Figure 3:
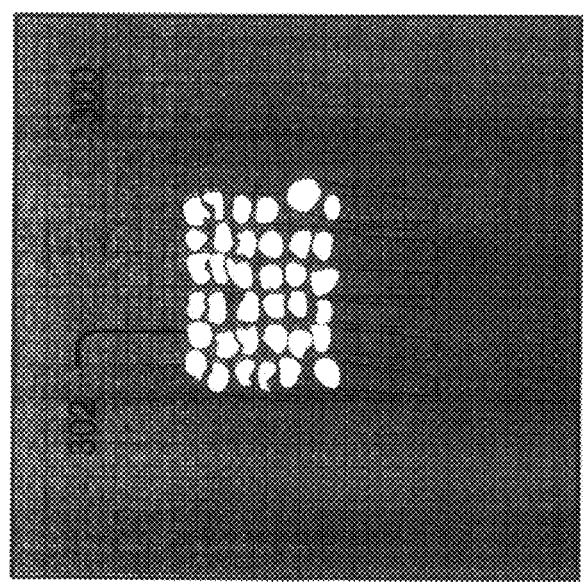
FIG. 3 illustrates a plurality of carbon nanotubes under magnification.

CNT may be grown to lengths of approximately 100 µm (1 µm=$10^{-6}$) with diameters of approximately 10 nm (1 nm= $10^{-9}$). FIG. 3 represents an array 300 of CNT 302 grown on silicon using a conventional chemical vapor deposition ("CVD") process by selective deposition of a catalyst. The illustration in FIG. 4 is a schematic of a single walled CNT 400 with a metallized wall 404. The metallized wall 402 wicks up the CNT filament 404 during the CVD process. Further, growth of a single walled CNT may be terminated by covering the exposed CNT filament 404 with catalyst material, thereby closing it.

Figure 5:
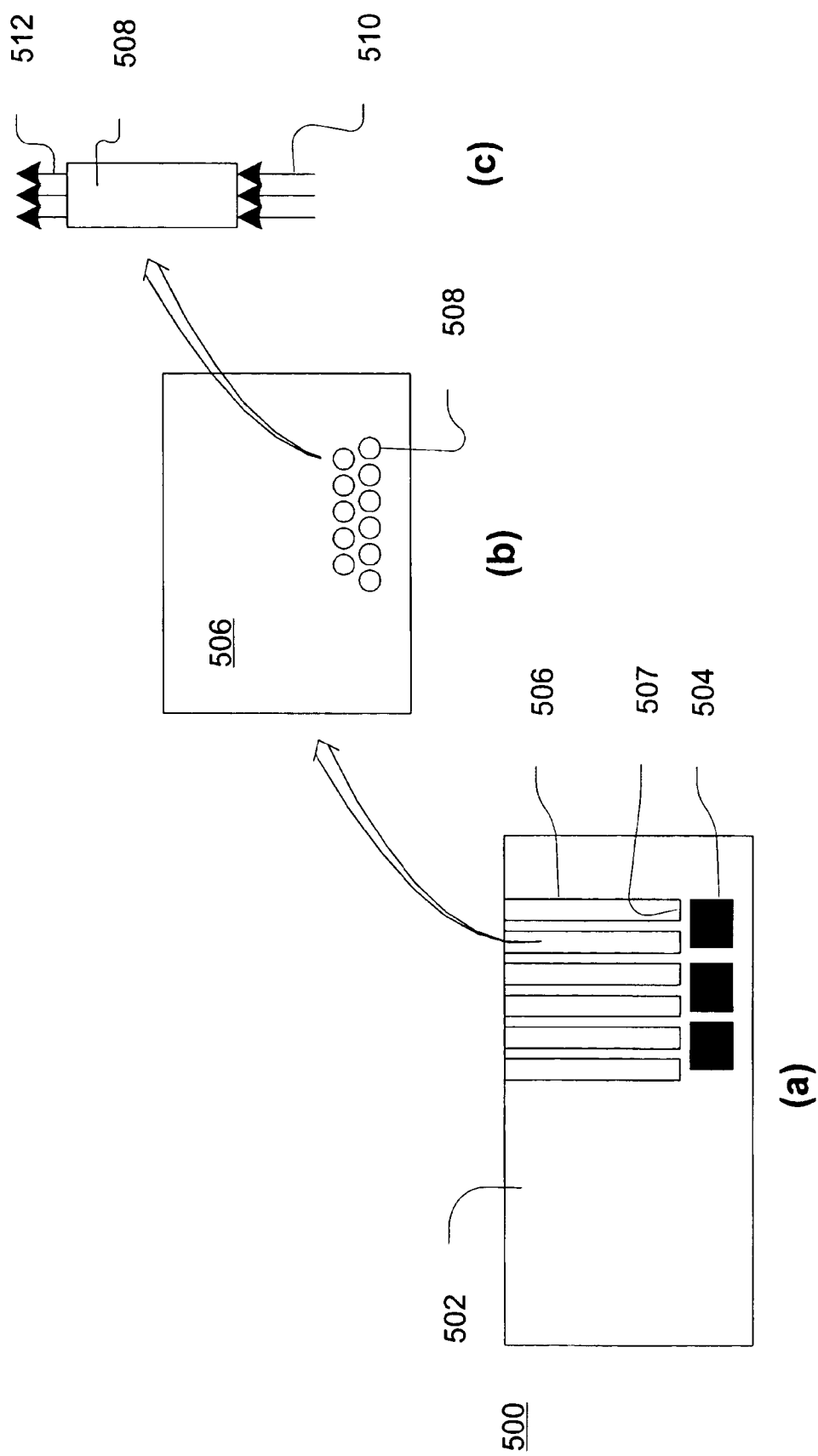
FIG. 5 illustrates an exploded view, of a die with a plurality of carbon nanotubes forming a several microchimneys or thermosiphons.

Including one or more CNT microchimneys or thermosiphons in a die will increase the effective thermal conductivity of the die and decrease the overall package thermal resistance and achieve benefits similar to those discussed above with regard to FIG. 2. FIG. 5 illustrates an embodiment of a CNT microchimney 506.

FIG. 5(a) illustrates a cross-sectional view of a portion of a die 500 incorporating a CNT microchimney 506. The bulk die material, also referred to as a substrate, such as a Silicon on Insulator ("SOI") substrate, in the embodiment of FIG. 5 forms cavities from a back side 502 of the die 500 in regions near active die circuitry 504 that heat the die 500.

FIG. 5(b) illustrates a cross-sectional view of the microchimney 506 along an axis perpendicular to the backside 502 of the die 500. Each microchimney 506 has a plurality of CNT 508 coupled to the bulk die material forming the cavity, on a side closest 507 to the active die circuitry 504. The illustration of FIG. 5(b) omits a significant portion of the array of CNT 508 for clarity. Embodiments contemplated by FIG. 5 include embodiments with arrays of CNT 508 substantially filling the cross-section of the microchimney 506 cavity as well as embodiments only partially filling the microchimney 506 cavity with CNTs 508, as illustrated in FIG. 5(b).

FIG. 5(c) illustrates a side view of a CNT 508 included in an embodiment of a microchimney 506 similar to FIGS. 5(a)-(b). A substantial portion of heat in 510 to the base of CNT 508 is transferred out 512 of the terminal end of the CNT 508, a result of the proportionately high axial thermal conductivity of the CNT 508. Because embodiments contemplated by FIG. 5 couple one end of each CNT 508 in the plurality to the bulk die material near active circuitry 504, the effective thermal conductivity of the die 500 increases compared to that of the bulk die material.

Examples of active circuitry 504 include circuitry forming functional sub-parts of microprocessors, multiple core microprocessors, graphics processors, memory controllers, application specific integrated circuits (ASICs), chipsets, and combinations thereof. An exemplary functional sub-part of a microprocessor or multiple core microprocessor is the portion of circuitry performing floating point operations.

Including a plurality of microchimneys 506 in the die 500 only adds to the benefit discussed above. Further, modifications to CNT 508 geometry are possible to facilitate increased heat transfer. Thus, embodiments contemplated by FIG. 5 are wide ranging.

Figure 6:
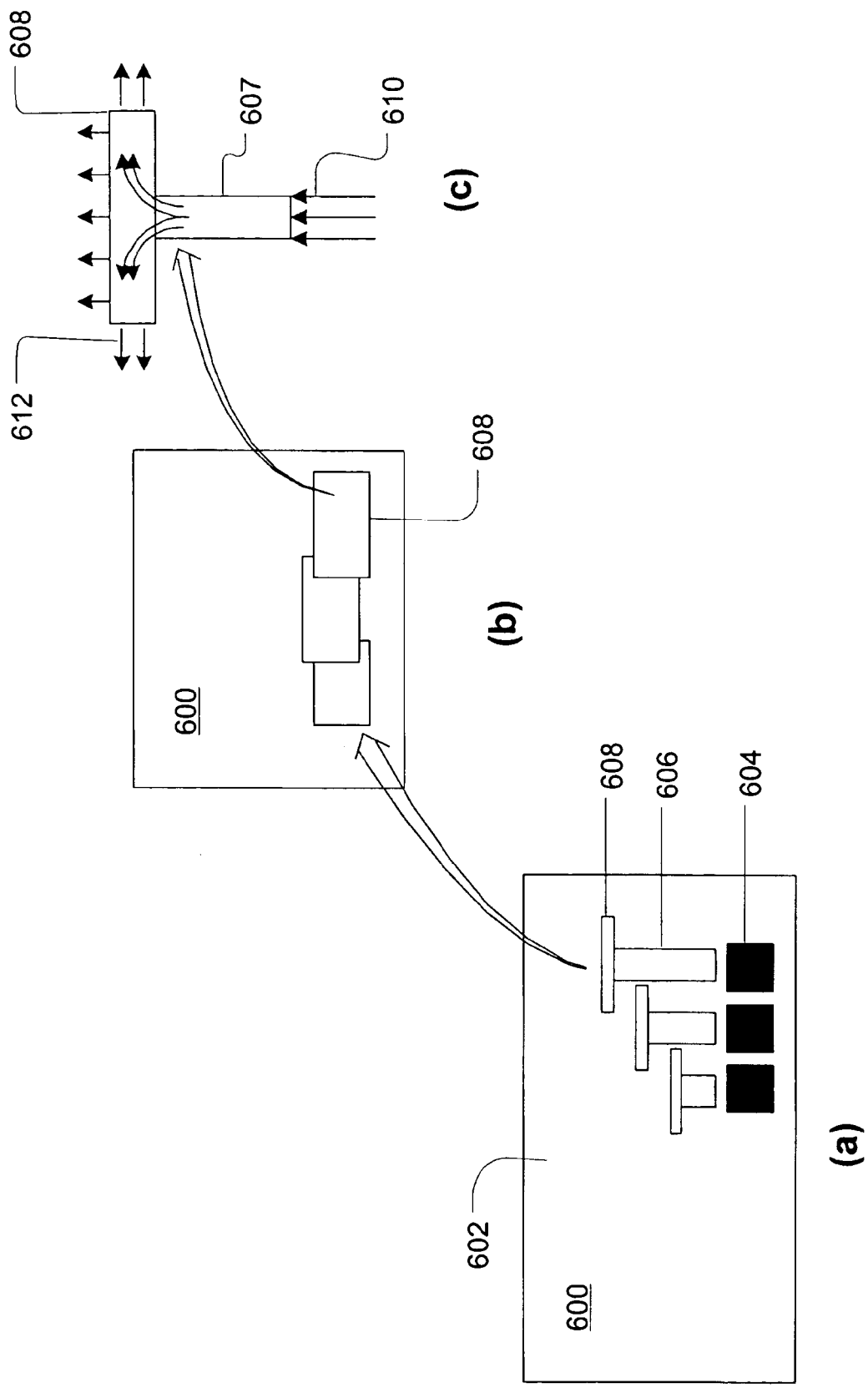
FIG. 6 illustrates an embodiment alternative to that illustrated in FIG. 5 that facilitates improved lateral heat spreading.

For example, FIG. 6 illustrates an embodiment of a die 600 alternative to that illustrated by FIG. 5. FIG. 6(a) illustrates a cross-sectional view of a portion of a die 600 incorporating a CNT microchimney 606. FIG. 6(b) illustrates a cross-sectional view of the microchimney 606 along an axis perpendicular to the backside 602 of the die 600.

The embodiment of FIG. 6 incorporates plates 608 in the microchimneys 606 to facilitate lateral heat spreading. Similar to the embodiment described in relation to FIG. 5, cavities are formed in a backside 602 of the die 600 in regions near active die circuitry 604 and CNT 607 are grown, forming microchimneys 606, to which are attached plates 608 at their terminal end.

FIG. 6(c) illustrates lateral heat spreading facilitated by the addition of plates 608 at the terminal end of microchimneys 606. A CNT 607 coupled to a plate 608 transfers heat input 610 to the plate 608 at the region of coupling. The heat then spreads within the plate and is transferred out of the plate (illustrated by arrows 612) over a larger area than the CNT 607 cross-sectional area (see FIG. 5(c)). Alternative embodiments may couple a plurality of CNT 607 from a single microchimney 606 to a single plate 608. A further embodiment may couple a plurality of CNT 607 from a plurality of microchimneys 606 to a single plate 608

As shown in FIG. 6(a)-(b), in an embodiment utilizing a plurality of plates 608, the plates 608 may overlap adjacent microchimneys 606. Thus, some staggering of heights of micro-chimneys 606 (and hence CNT 607) may be advantageous in that more or broader plates may be accommodated within a given die 600 region.

Many embodiments of plates 608 will be formed of thermally conductive material, with increased benefit of heat spreading resulting from higher thermal conductivities. Some embodiments of plates 608 may use alloys of copper to facilitate lateral heat spreading from coupling to CNT 607.

FIGS. 7-11 illustrate possible intermediate structures during manufacture of a thermally enhanced die using CNT. Although the present discussion is limited to embodiments on a unitary die, one skilled in the art will readily appreciate that the present discussion applies equally to embodiments on a wafer, prior to die singulation.

Figure 7:
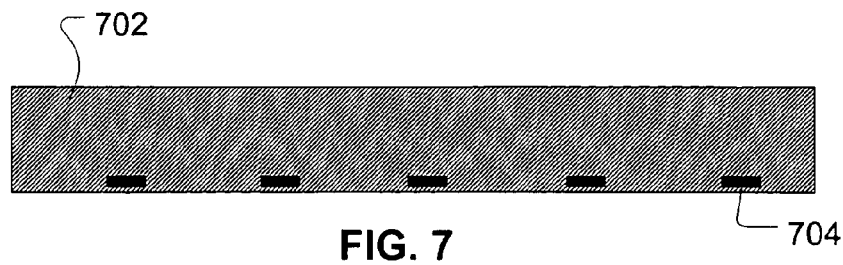
FIG. 7 illustrates a side-view cross-section of a die containing an integrated circuit with several regions of increased heat flux.
Figure 8:
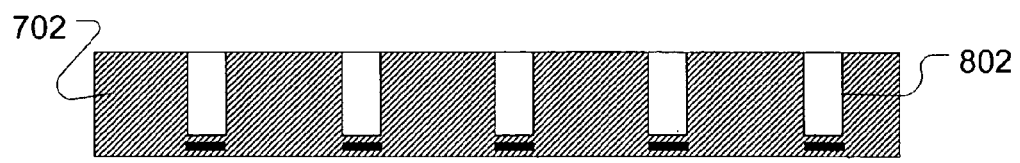
FIG. 8 illustrates the structure of FIG. 7, with several cavities in the die near the regions of increased heat flux.

FIG. 7 illustrates a portion of a die 702 with regions 704 near active circuitry illustrated. FIG. 8 illustrates the structure of FIG. 7 after undergoing a material removal process, forming cavities 802 in an inactive, back side of the die 702.

Exemplary material removal processes include chemical etching, micro machining, laser drilling, and other ablation methods.

Figure 9:
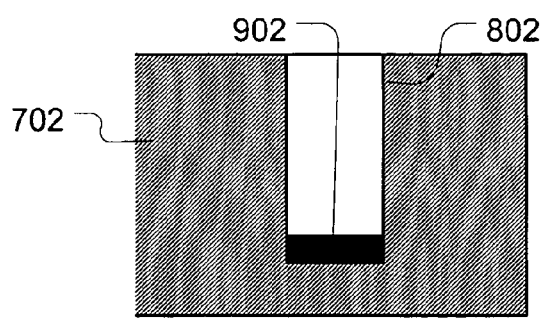
FIG. 9 illustrates part of the structure of FIG. 8 following deposition of a layer of catalyst on which carbon nanotubes may be grown in a subsequent manufacturing process.

FIG. 9 illustrates a portion of the structure of FIG. 8 near a cavity 802 after undergoing deposition of a metal catalyst 902 as a seed layer to facilitate CNT growth in a subsequent process.

Figure 10:
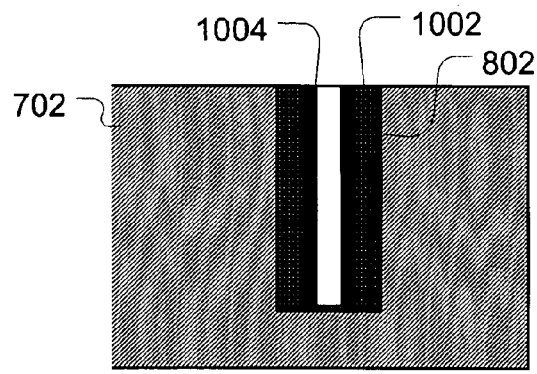
FIG. 10 illustrates the structure of FIG. 9 following growth of a plurality of carbon nanotubes.

FIG. 10 illustrates the structure of FIG. 9 after undergoing a CNT growth process.

An array 1002 of CNT is illustrated, showing a redistribution of the metal catalyst 902 after the growth process is complete, similar to the redistributed metallized wall 402 shown in FIG. 4. In use, the redistributed metal catalyst 902 also contributes to heat spreading. A CNT growth process may include plasma chemical vapor deposition (CVD) or thermal CVD.

Although embodiments of microchimneys have thus far been described, a thermosiphon is an alternative structure for increasing die effective thermal conductivity. Thermosiphons typically exhibit heat transfer capabilities equivalent to solid materials with high thermal conductivity by taking advantage of a working fluid's latent heat of vaporization and condensation. Microchimneys and thermosiphons have related CNT structures. The embodiment of a thermosiphon illustrated by FIG. 11 includes an array of CNT functioning as a wick structure and thereby combines the thermosiphon heat transfer mechanism with the inherently high axial thermal conductivity of a microchimney as previously described.

Figure 11:
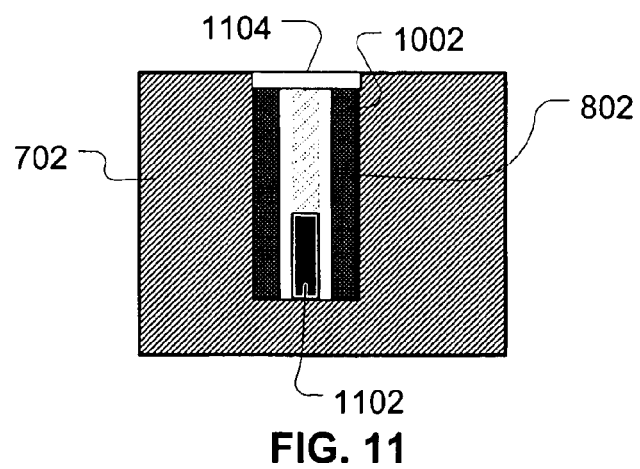
FIG. 11 illustrates the structure of FIG. 8 with a saturated mixture of a working fluid sealed within the cavity.

To illustrate the similarity between microchimney and thermosiphon structure, FIG. 11 illustrates the structure of FIG. 10 after completing growth of the array of CNT 1002 and after filling the cavity 802 with a saturated mixture (both liquid and gaseous phases are present) of working fluid 1102, and sealing it with a cap 1104 to contain the working fluid 1102.

Generally, thermosiphons combine four basic structures confined within a single vessel: an evaporator, a working fluid 1102, a condenser, and a wick, illustrated in FIG. 11 by the array of CNT 1002. A typical thermosiphon evaporator may be partially or wholly exposed to a region near a heat source. The liquid phase of the working fluid 1102 generally accumulates in the evaporator section and the gas phase generally accumulates in the condenser section. As heat is absorbed by the evaporator section, the liquid phase partially evaporates and is driven under its vapor pressure (resulting from the increased kinetic energy associated with a gas phase) to the condenser section, where heat is rejected and condensation occurs. The wick structure, through capillary forces deriving from the liquid's surface tension, pumps the condensed liquid back to the reservoir, thus completing the basic thermosiphon operating cycle.

Various alternative embodiments of working fluid 1102 may be used with the thermosiphon illustrated by FIG. 11. For example, the working fluid 1102 may include a perfluorinated fluid, water, propylene glycol, a poly-alcohol, and a combination thereof.

Figure 12:
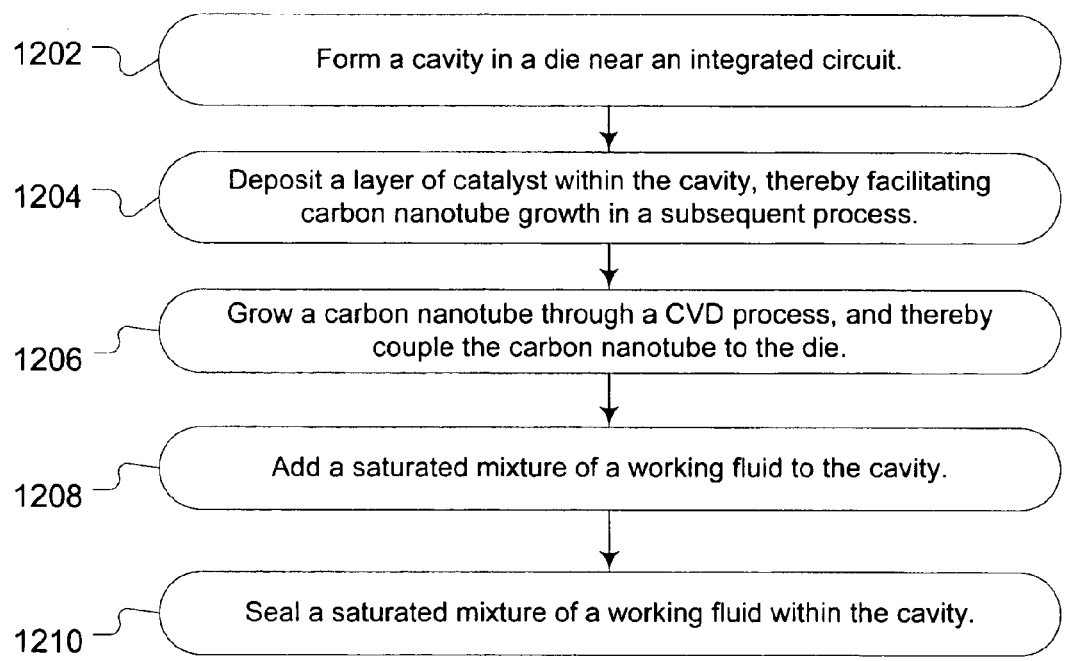
FIG. 12 illustrates a method forming a thermosiphon using a carbon nanotube wick structure.

FIG. 12 illustrates an exemplary method of forming a thermosiphon in accordance with the above described embodiments. A method by which a thermosiphon may be manufactured includes forming a cavity in a die near an integrated circuit 1202. A subsequent process in the exemplary method includes depositing a layer of catalyst within the cavity, thereby facilitating CNT growth in a subsequent process 1204. A subsequent CNT growth process, leading to coupling between the CNT and die, may include a chemical deposition process 1206. To this point, the exemplary method described in relation to FIG. 12 also describes an exemplary method of forming a microchimney. Adding a saturated mixture of a working fluid to the cavity 1208, and sealing the saturated mixture within the cavity 1210, completes the exemplary method leading to formation of a thermosiphon.

Figure 13:
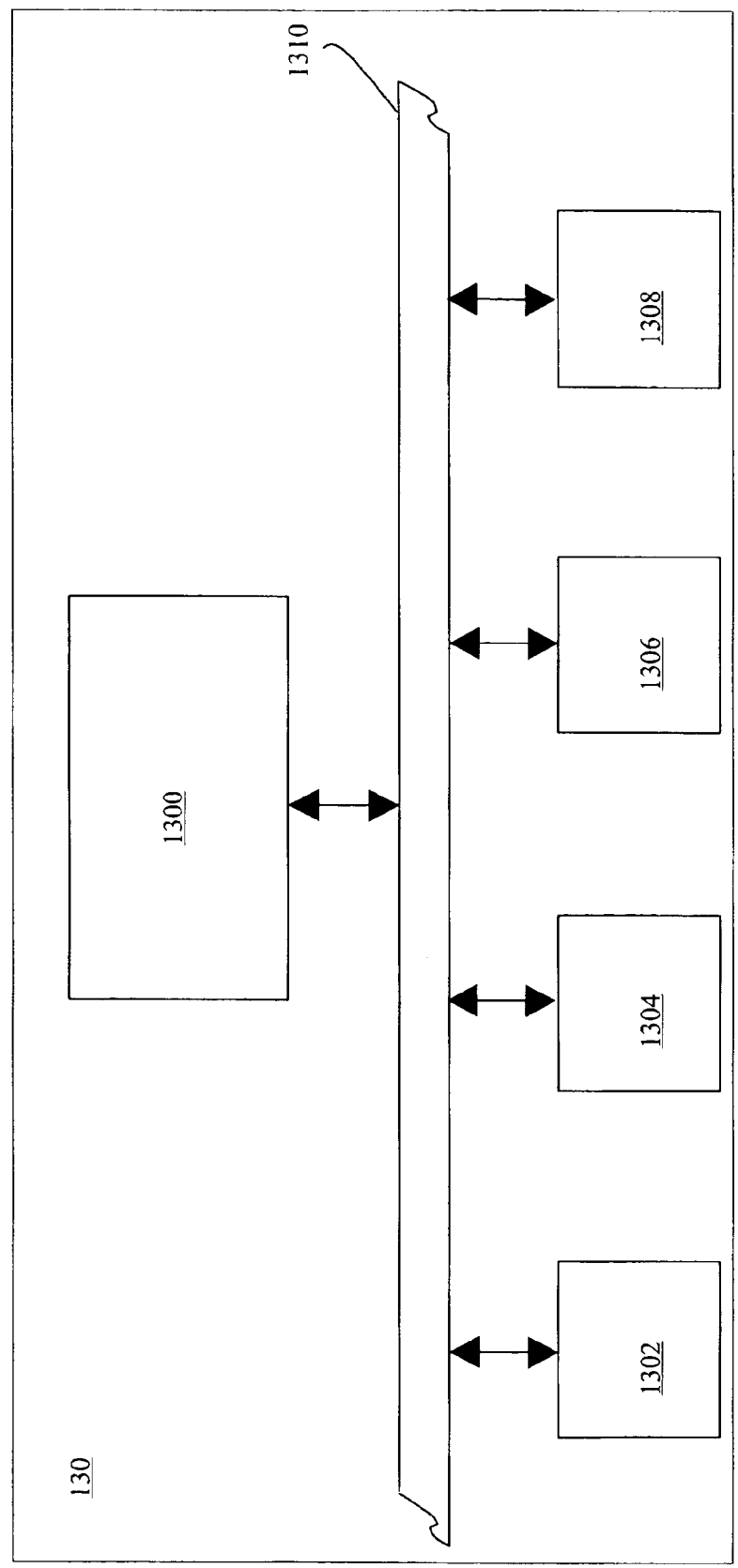
FIG. 13 illustrates a block diagram of an embodiment of a system including an integrated circuit package that further includes a carbon nanotube micro-chimney or thermosiphon.

FIG. 13 illustrates a schematic representation of one of many possible system embodiments including a package containing an integrated circuit 1300, which in turns includes a microchimney or thermosiphon similar to any described above. In an embodiment, the integrated circuit may include a microprocessor. In an alternate embodiment, the integrated circuit package 1300 may include an application specific integrated circuit (ASIC). Alternatively, integrated circuits found in chipsets (e.g., graphics, sound, and control chipsets) or memory may also be packaged in accordance with embodiments herein described.

In an embodiment similar to that illustrated in FIG. 13, a system 130 may also include a main memory 1302, a graphics processor 1304, a mass storage device 1306, and an input/output module 1308 coupled to each other by way of a bus 1310, as shown. Examples of the memory 1302 include but are not limited to static random access memory (SRAM) and dynamic random access memory (DRAM). Examples of the mass storage device 1306 include but are not limited to a hard disk drive, a flash drive, a compact disk drive (CD), a digital versatile disk drive (DVD), and so forth. Examples of the input/output modules 1308 include but are not limited to a keyboard, cursor control devices, a display, a network interface, and so forth. Examples of the bus 1310 include but are not limited to a peripheral control interface (PCI) bus, PCI Express bus, Industry Standard Architecture (ISA) bus, and so forth. In various embodiments, the system 130 may be a wireless mobile phone, a personal digital assistant, a pocket PC, a tablet PC, a notebook PC, a desktop computer, a set-top box, an audio/video controller, a DVD player, a network router, a network switching device, or a server.

Although specific embodiments have been illustrated and described herein for purposes of description of an embodiment, those of ordinary skill in the art will appreciate that a wide variety of alternate and/or equivalent implementations calculated to achieve similar purposes may be substituted for the embodiments shown and described without departing from the scope of the present disclosure. This detailed description is thus intended to cover any adaptations or variations of embodiments. Therefore, it is manifestly intended that only the claims and the equivalents thereof be taken as limiting.

What is claimed is:

1. A method of packaging a semiconductor comprising:
   forming a cavity within a die near a region heated by an integrated circuit;
   growing, within the cavity, a plurality of carbon nanotubes coupled to the die;
   adding a saturated mixture of working fluid to the cavity; and
   sealing the saturated mixture within the cavity.

2. The method of claim 1, wherein the working fluid comprises a selected one of the group including a perfluorinated fluid, water, propylene glycol, a poly-alcohol, and a combination thereof.

3. The method of claim 1 wherein forming the cavity further comprises one selected from the group consisting of micromachining, chemical etching, laser drilling, an ablation method, and a combination thereof.

4. The method of claim 1, further comprising a plate coupled to one or more of the plurality of carbon nanotubes.

5. The method of claim 1, wherein the integrated circuit further comprises a selected one of the group including microprocessor, a multiple core microprocessor, a graphics processor, a memory controller, an ASIC, and a chipset, or a combination thereof.

6. The method of claim 1, wherein the integrated circuit comprises a selected one of the group including microprocessor, a graphics processor, a memory controller, or a chipset, or a combination thereof.

* * * * *